(12) United States Patent
Sun et al.

(10) Patent No.: US 9,768,236 B2
(45) Date of Patent: Sep. 19, 2017

(54) ORGANIC LIGHT EMITTING DIODE DISPLAY PANEL AND MANUFACTURING METHOD THEREOF

(71) Applicant: BOE TECHNOLOGY GROUP CO., LTD., Beijing (CN)

(72) Inventors: Tuo Sun, Beijing (CN); Ying Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,738

(22) PCT Filed: Jul. 18, 2014

(86) PCT No.: PCT/CN2014/082506
§ 371 (c)(1),
(2) Date: Apr. 14, 2015

(87) PCT Pub. No.: WO2015/161573
PCT Pub. Date: Oct. 29, 2015

(65) Prior Publication Data
US 2017/0040390 A1   Feb. 9, 2017

(30) Foreign Application Priority Data

Apr. 22, 2014 (CN) .......................... 2014 1 0163110

(51) Int. Cl.
*H01L 29/08*   (2006.01)
*H01L 27/32*   (2006.01)
(Continued)

(52) U.S. Cl.
CPC ...... *H01L 27/3218* (2013.01); *H01L 51/5012* (2013.01); *H01L 51/5206* (2013.01);
(Continued)

(58) Field of Classification Search
CPC . H01L 27/3218; H01L 51/56; H01L 51/5012; H01L 51/5206; H01L 51/5221; H01L 51/5209; H01L 2251/5315
(Continued)

(56) References Cited

U.S. PATENT DOCUMENTS

2008/0138653 A1   6/2008 Lee et al.
2008/0157657 A1   7/2008 Matsunami et al.
2013/0248836 A1*  9/2013 Yokoyama ........ G02F 1/133555
                                                    257/40

FOREIGN PATENT DOCUMENTS

CN        1953199 A      4/2007
CN      101198201 A      6/2008
(Continued)

OTHER PUBLICATIONS

Office Action in Chinese Application No. 201410163110.X dated Aug. 1, 2016, with English translation. 5 pages.
(Continued)

*Primary Examiner* — Vongsavanh Sengdara
(74) *Attorney, Agent, or Firm* — Blakely Sokoloff Taylor & Zafman LLP

(57) ABSTRACT

An organic light emitting diode display panel and a manufacturing method thereof. The display panel includes a plurality of pixel units arranged in arrays, each pixel unit has a first electrode layer, a second electrode layer and at least three light emitting layers. Each light emitting layer includes a planar light emitting layer and at least two annular light emitting layers disposed concentrically with the planar light emitting layer. The first electrode layer has a planar first electrode at a location that corresponds to the planar light emitting layer, and the first electrode layer has an annular first electrode at a location that corresponds to each annular light emitting layer.

4 Claims, 3 Drawing Sheets

(51) Int. Cl.
H01L 51/56 (2006.01)
H01L 51/50 (2006.01)
H01L 51/52 (2006.01)

(52) U.S. Cl.
CPC ...... *H01L 51/5209* (2013.01); *H01L 51/5221* (2013.01); *H01L 51/56* (2013.01); *H01L 2251/5315* (2013.01)

(58) Field of Classification Search
USPC .......................................................... 257/40
See application file for complete search history.

(56) References Cited

FOREIGN PATENT DOCUMENTS

| CN | 103022051 A | | 4/2013 |
|---|---|---|---|
| CN | 203787434 U | | 8/2014 |
| CN | 203787434 U | | 8/2014 |
| JP | 2657159 | | 9/1997 |
| JP | 2011071012 A | * | 4/2011 |

OTHER PUBLICATIONS

International Search Report (PCT/CN2014/082506) dated Apr. 22, 2014, 6 pages.
Chinese Office Action with English Language Translation, dated Mar. 3, 2016, Chinese Application No. 201410163110.X.

* cited by examiner

ORGANIC LIGHT EMITTING DIODE DISPLAY PANEL AND MANUFACTURING METHOD THEREOF

TECHNICAL FIELD

The present disclosure relates to the display technical field, and in particular, to an organic light emitting diode display panel and a manufacturing method thereof.

BACKGROUND ART

OLED (Organic Light-Emitting Diode) display screens have been listed as the next-generation display technique with much prospect for development due to their advantages such as thinness, light weight, wide perspective, active luminescence, continuous and tunable emission colors, low cost, rapid responding speed, low energy consumption, low driving voltage, wide range for operating temperature, simple fabrication process, high emission efficiency, and flexibility display, etc.

An OLED basic structure includes an anode, a cathode and an organic light emitting layer located between the anode and the cathode. OLED luminescence refers to a phenomenon of light emission caused by the anode and cathode carriers pouring-in and recombining, as the organic light emitting layer is driven by an applied electric field. Specifically, electrons and holes as the carriers are shifted from the cathode and the anode respectively to the organic light emitting layer under the effect of the electric field and meet in the organic light emitting layer for recombination to form excitons, which excitons are deactivated to release energy, and the released energy is to excite the light emitting molecules in the organic light emitting layer and the excited light emitting molecules to undergo radiative relaxation and thereby emit visible light.

OLEDs may be divided into the two types of Passive Matrix OLEDs (PMOLED) and Active Matrix OLEDs (AMOLED) depending on different driving modes, of which the PMOLED consists of cathodes and anodes in matrix form, scan-illuminating pixels in the arrays, where each pixel is operated in a short-pulse mode and emits light instantaneously in high luminance, and with a simple structure thereof, it can effectively reduce the manufacturing cost, but is not suited for application in large-sized and high-resolution display panels for its driving voltage is comparatively high. The AMOLED instead uses an independent Thin Film Transistor (TFT) to control each pixel, where each pixel can be continuously and independently driven to emit light, and since the AMOLED requires a lower driving voltage and has a longer life, it is applicable to large-sized tablet display, whereas its manufacturing process is more complicated and higher in cost.

In the prior art, an AMOLED display panel comprises a plurality of pixel units arranged in arrays. As shown in FIG. 1, each pixel unit 100 includes a red light emitting device 2, a green light emitting device 3 and a blue light emitting device 4 disposed in parallel, and a thin film transistor 5 corresponding to each color light emitting device.

Current AMOLED display panels have the drawback that when the screen is viewed from a close distance, the pixel units are presented with color edge phenomenon, thus affecting the display effect of the display panel. In addition, the light emitting layers for each color light emitting device need to be formed using independent precision metal mask evaporation, which results in a comparatively high manufacturing cost for such display panels.

SUMMARY OF THE DISCLOSURE

Embodiments of the present disclosure provide an organic light emitting diode display panel and a manufacturing method thereof, in order to improve the display effect of the display panel.

The organic light emitting diode display panel provided by an embodiment of the present disclosure comprises a plurality of pixel units arranged in arrays, each pixel unit comprising a first electrode layer, a second electrode layer and at least three light emitting layers corresponding to different colors located between the first electrode layer and the second electrode layer, wherein:

the at least three light emitting layer includes a planar light emitting layer and at least two annular light emitting layers disposed concentrically with the planar light emitting layer and aligned radially;

the first electrode layer has a planar first electrode at a location that corresponds to the planar light emitting layer, and the first electrode layer has an annular first electrode at a location that corresponds to each annular light emitting layer.

In the technical solution of the present disclosure, at least three light emitting layers are disposed concentrically, capable of easing the color edge phenomenon at the pixel units when viewed from a close distance, thus improving largely the display effect of the display panel.

Optionally, the at least three light emitting layers include a red light emitting layer, a green light emitting layer and a blue light emitting layer.

Preferably, the red light emitting layer is a planar light emitting layer. The green light emitting layer and the blue light emitting layer are annular light emitting layers respectively and are radially aligned. The green light emitting layer has internally a first transmission layer of the same material, which first transmission layer covers the red light emitting layer. The blue light emitting layer has internally a second transmission layer of the same material, which second transmission layer covers the green light emitting layer and the first transmission layer. The green light emitting layer and the first transmission layer are manufactured with the same organic material; the blue light emitting layer and the second transmission layer are manufactured with the same organic material, in which way the manufacturing process for the light emitting layers can be largely simplified. Further, since the blue light emitting layer does not have the risk of color mixing, the blue light emitting layer and second transmission layer as a whole can use a less precise mask for the manufacture, with which the manufacturing cost is saved to a significant extent.

Optionally, the red light emitting layer, the green light emitting layer and the blue emitting layer are situated at a same level.

Preferably, a boundary defining frame is provided respectively between the planar first electrode and the adjacent annular first electrode, between adjacent annular first electrodes, and outside of the out-most annular first electrode. The boundary defining frame is used for spacing apart the first electrodes so as to guarantee that the first electrodes can operate independently and reliably.

The manufacturing method provided by an embodiment of the present disclosure comprises:

forming a first electrode layer on a substrate plate, the first electrode layer comprising a planar first electrode and at least two annular first electrodes disposed concentrically with the planar first electrode and aligned radially;

forming a planar light emitting layer above and opposing the location of the planar first electrode, forming an annular light emitting layer above and opposing the location of each annular first electrode, the planar light emitting layer and the respective annular light emitting layers corresponding to different colors respectively;

forming a second electrode layer above the planar light emitting layer and the respective annular light emitting layers.

On the display panel manufactured by steps of the method, the respective light emitting layers of each pixel unit are disposed concentrically capable of easing the color edge phenomenon at the pixel units when viewed from a close distance, thus improving largely the display effect of the display panel.

Preferably, the forming a planar light emitting layer above and opposing the location of the planar first electrode and forming an annular light emitting layer above and opposing the location of each annular first electrode specifically comprises:

forming a red light emitting layer above and opposing the location of the planar first electrode;

using a green luminescent layer material, forming a first transmission layer to cover the red light emitting layer and a green light emitting layer located outside of the first transmission layer;

using a blue luminescent layer material, forming a second transmission layer to cover the green light emitting layer and the first transmission layer, and a blue light emitting layer located outside of the second transmission layer.

The green light emitting layer and the first transmission layer are manufactured with the same organic material; the blue light emitting layer and the second transmission layer are manufactured with the same organic material, in which way the manufacturing process for the light emitting layers can be largely simplified. Further, since the blue light emitting layer does not have the risk of color mixing, the blue light emitting layer and the second transmission layer as a whole can use a less precise mask for the manufacture, with which the manufacturing cost is saved to a significant extent.

Preferably, after forming the first electrode layer and prior to forming the red light emitting layer, it further comprises:

forming a boundary defining frame respectively between the planar first electrode and the adjacent annular first electrode, between adjacent annular first electrodes, and outside of the out-most annular first electrode.

The boundary defining frame is used for spacing apart the first electrodes so as to guarantee that the first electrodes can operate independently and reliably.

Preferably, after forming the boundary defining frame and prior to forming the red light emitting layer, it further comprises: forming a first common layer.

Preferably, after forming the blue light emitting layer, it further comprises forming a second common layer, the second electrode layer located in the structure of the second common layer.

REFERENCE SIGNS

1—substrate plate; 2—red light emitting device; 3—green light emitting device; 4—blue light emitting device; 5—thin film transistor;

100—pixel unit; 6—first electrode layer; 7—second electrode layer; 8—planar light emitting layer;

9—annular light emitting layer; 61—planar first electrode; 62—annular first electrode; 10—first transmission layer;

11—second transmission layer; 12—boundary defining frame; 13—first common layer; 14—second common layer.

EMBODIMENTS OF THE DISCLOSURE

In order to improve the display effect of a display panel, embodiments of the present disclosure provide an organic light emitting diode (OLED) display panel and a manufacturing method thereof. In the technical solution of the present disclosure, the at least three light emitting layer includes a planar light emitting layer and at least two annular light emitting layers disposed concentrically with the planar light emitting layer and aligned radially. The solution in which at least three light emitting layers are concentrically disposed can ease the color edge phenomenon at the pixel units when viewed from a close distance, thus improving largely the display effect of the display panel.

In order for the objects, technical solutions and advantages of the present disclosure to become more apparent, embodiments are enumerated as follows to illustrate the present disclosure further in detail.

Figure 1:
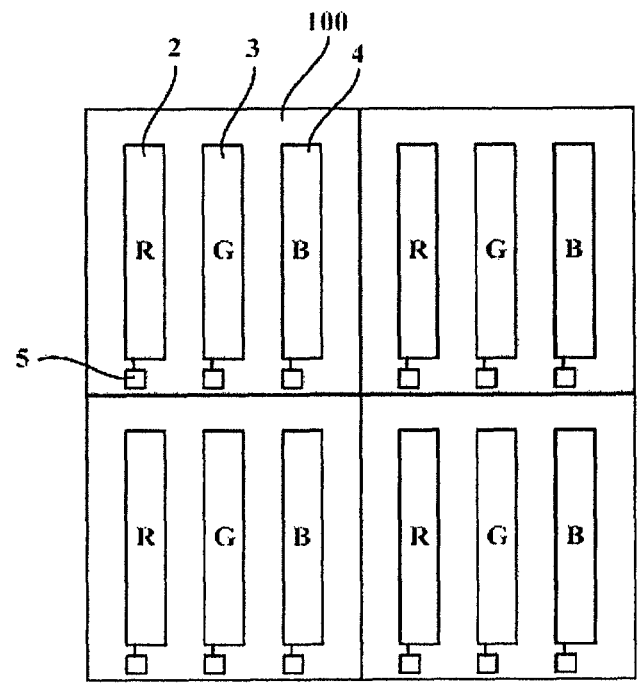
FIG. 1 is a schematic diagram of the top-view structure of a prior art AMOLED display panel.
Figure 2:
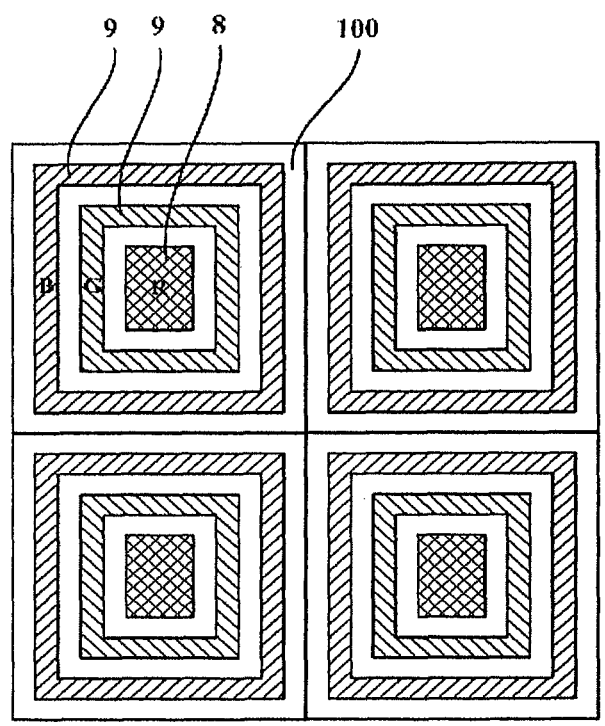
FIG. 2 is a schematic diagram of the top-view structure of an OLED display panel of one embodiment of the present disclosure.
Figure 3:
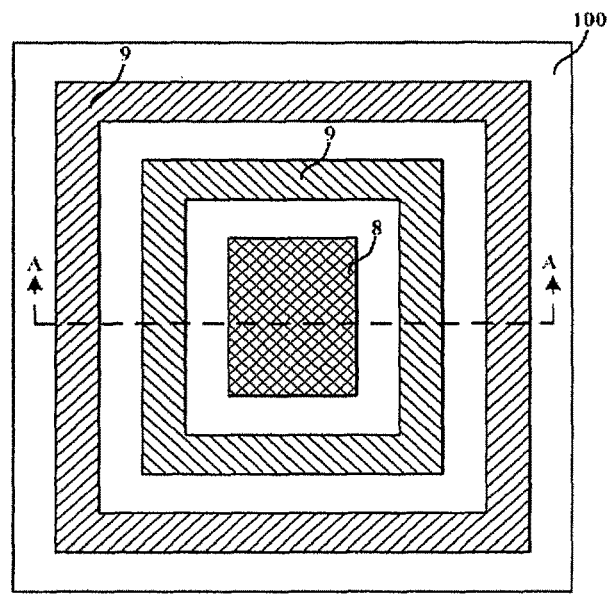
FIG. 3 is a schematic diagram of the top-view structure of a pixel unit in FIG. 2.
Figure 4:
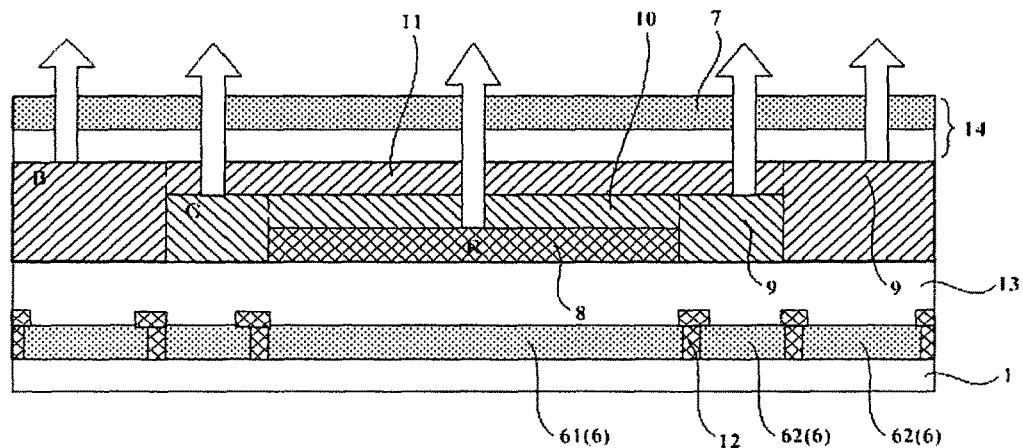
FIG. 4 is a schematic diagram of the sectional structure at A-A in FIG. 3.

As shown in FIG. 2, FIG. 3 and FIG. 4, an OLED display panel provided by one embodiment of the present disclosure comprises a plurality of pixel units 100 arranged in arrays. Each pixel unit 100 includes a first electrode layer 6, a second electrode layer 7 and at least three light emitting layers corresponding to different colors located between the first electrode layer 6 and the second electrode layer 7, wherein:

the at least three light emitting layer includes a planar light emitting layer 8 and at least two annular light emitting layers 9 disposed concentrically with the planar light emitting layer 8 and aligned radially;

the first electrode layer 6 has a planar first electrode 61 at a location that corresponds to the planar light emitting layer 8, and the first electrode layer 6 has an annular first electrode 62 at a location that corresponds to each annular light emitting layer 9.

The OLED display panel provided by one embodiment of the present disclosure can be either a PMOLED display panel or an AMOLED display panel. As shown in FIG. 4, the OLED in the embodiment is an upward emission type, whereas in other embodiments of the present disclosure, the OLED can alternatively be a downward emission type. The first electrode layer 6 can specifically be an anode layer and the second electrode layer 7 is in turn a cathode layer, or the first electrode layer 6 is a cathode layer and the second electrode layer 7 is in turn an anode layer.

The specific structure of the pixel unit 100 is not limited, for example, it can include a red light emitting layer (R emission layer), a green light emitting layer (G emission layer), a blue light emitting layer (B emission layer), or alternatively include a red light emitting layer (R emission layer), a green light emitting layer (G emission layer), a blue light emitting layer (B emission layer) and a white light emitting layer (W emission layer), which are not limitations to the present disclosure. The embodiment in which the structure includes a red light emitting layer, a green light emitting layer and a blue light emitting layer is taken as an example for illustration as follows.

Continue to refer to FIG. 3 and FIG. 4. Preferably, the red light emitting layer is a planar light emitting layer 8, the green light emitting layer and the blue light emitting layer are respectively annular light emitting layers 9 and aligned radially. The green light emitting layer has internally a first transmission layer 10 of the same material, which first transmission layer 10 covers the red light emitting layer. The blue light emitting layer has internally a second transmission layer 11 of the same material, which second transmission layer 11 covers the green light emitting layer and the first transmission layer 10. The green light emitting layer and the first transmission layer 10 are manufactured with the same organic material; the blue light emitting layer and the second transmission layer 11 are manufactured with the same organic material, in which way the manufacturing process for the light emitting layers can be largely simplified. Further, since the blue light emitting layer does not have the risk of color mixing, the blue light emitting layer and the second transmission layer 11 as a whole can use a less precise mask for the manufacture by a large-area evaporation, with which the manufacturing cost is saved to a significant extent.

The structure of the OLED device is commissionable based on the industry practices. Appropriate thickness is selected for the functional layers, and a light emitting region is implemented at the red light emitting layer. The first transmission layer 10 of the same material with the green light emitting layer and the second transmission layer 11 of the same material with the blue light emitting layer function to transmit electrons only, and holes in the OLED device structure to recombine with the electrons are located at the red light emitting layer. Likewise, at a light emitting region of the green light emitting layer, the second transmission layer 11 of the same material with the blue light emitting layer functions to transmit electrons only, and holes to recombine with the electrons are located at the green light emitting layer. Since the red light has a longer wavelength than the green and the blue light, the red light transmission in the first transmission layer 10 and the second transmission layer 11 will not be absorbed. Likewise, since the green light has a longer wavelength than the blue light, the green light transmission in the second transmission layer 11 will not be absorbed. The OLED device can emit light normally.

On the pixel structure of a prior art OLED display panel, since the red light emitting device, the green light emitting device and the blue light emitting device are disposed in parallel, with differences mutually in their geometrical centers, the pixel units show color edge phenomenon when the screen is viewed from a close distance, thus affecting the display effect of the display panel. In contrast, in a pixel structure of an OLED display panel according to embodiments of the present disclosure, at least three light emitting layers are disposed concentrically, capable of easing the color edge phenomenon at the pixel units when viewed from a close distance, thus improving largely the display effect of the display panel.

Continue to refer to FIG. 4, a boundary defining frame 12 is provided respectively between the planar first electrode 61 and the adjacent annular first electrode 62, between adjacent annular first electrodes 62, and outside of the out-most annular first electrode 62. Correspondingly, the white regions between adjacent light emitting layers in FIG. 3 are non-emitting regions opposing the locations of the boundary defining frames 12. The boundary defining frame 12 is used for spacing apart the first electrodes so as to guarantee that the first electrodes can operate independently and reliably. In addition, the OLED device has also a first common layer 13 provided between the first electrode layer 6 and the red light emitting layer (when the first electrode layer 6 is an anode layer, the structure of the common layer 13 can include a holed transmission layer), and a second common layer 14 provided above the blue light emitting layer (the structure of the second common layer 14 can include the second electrode layer 7 as a cathode layer and a holed transmission layer located between the cathode layer and the blue light emitting layer).

Figure 5:
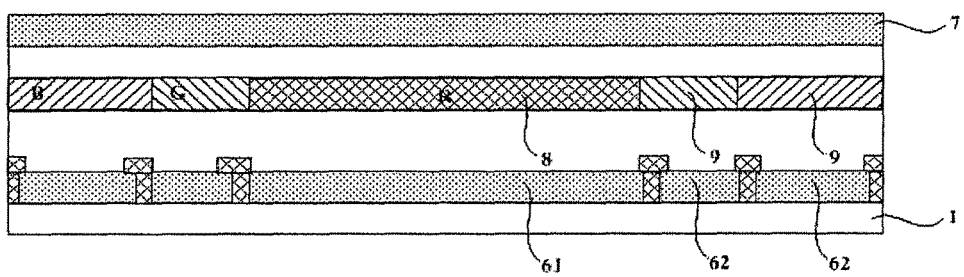
FIG. 5 is a schematic diagram of the sectional structure of a pixel unit in another embodiment of the present disclosure.

As shown in FIG. 5, in another embodiment of the present disclosure, the red light emitting layer, the green light emitting layer and the blue light emitting layer are situated at a same level. The individual light emitting layers are disposed concentrically and aligned radially. This embodiment can also ease the color edge phenomenon at the pixel units when viewed from a close distance, thus improving the display effect of the display panel.

Figure 6:
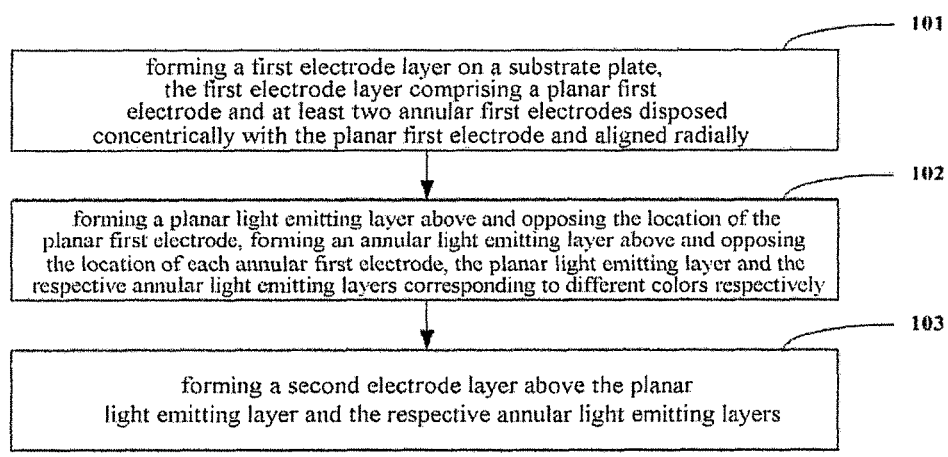
FIG. 6 is a process flow diagram of an OLED display panel manufacturing method of a further embodiment of the present disclosure.

As shown in FIG. 6, one embodiment of the present disclosure provides also a manufacturing method of the OLED display panel shown in FIG. 4, comprising the steps of:

101 forming a first electrode layer 6 on a substrate plate 1, the first electrode layer 6 comprising a planar first electrode 61 and at least two annular first electrodes 62 disposed concentrically with the planar first electrode 61 and aligned radially;

102 forming a planar light emitting layer 8 above and opposing the location of the planar first electrode 61, forming an annular light emitting layer 9 above and opposing the location of each annular first electrode 62, the planar light emitting layer 8 and the respective annular light emitting layers 9 corresponding to different colors respectively;

103 forming a second electrode layer 7 above the planar light emitting layer 8 and the respective annular light emitting layers 9.

On the display panel manufactured by steps of the method, the respective light emitting layers of each pixel unit are disposed concentrically capable of easing the color edge phenomenon at the pixel units when viewed from a close distance, thus improving largely the display effect of the display panel.

Preferably, the step 102 specifically comprises:

forming a red light emitting layer above and opposing the location of the planar first electrode 61;

using a green luminescent layer material, forming a first transmission layer 10 to cover the red light emitting layer and a green light emitting layer located outside of the first transmission layer 10;

using a blue luminescent layer material, forming a second transmission layer 11 to cover the green light emitting layer and the first transmission layer 10, and a blue light emitting layer located outside of the second transmission layer 11.

An evaporation process is generally used for forming an OLED device on a substrate plate. It refers to heating an evaporation material in a vacuum condition such that the evaporation material melts (or sublimates) into a vapor composed of atoms, molecules or atom aggregates and condenses then at a surface of the substrate plate to form a film, thereby forming a functional layer of the OLED device. For forming a pattern for each individual functional layer at the substrate surface, it requires using a mask, whereas in the prior art, the light emitting layers for each color light emitting device need to be formed using independent precision metal mask evaporation, which results in a comparatively high manufacturing cost for such display panels. In contrast, in the technical solution of the present disclosure, the green light emitting layer and the first transmission layer 10 are manufactured with the same organic material; the blue light emitting layer and the second transmission layer 11 are manufactured with the same organic material, so that the manufacturing process for the light emitting layers is more simplified. Further, since the blue light emitting layer does not have the risk of color mixing, the blue light emitting layer and the second transmission layer 11 as a whole can use a less precise mask for the manufacture by a large-area evaporation, with which the manufacturing cost is saved to a significant extent.

Preferably, after forming the first electrode layer 6 and prior to forming the red light emitting layer, it further comprises:

forming a boundary defining frame 12 respectively between the planar first electrode 61 and the adjacent annular first electrode 62, between adjacent annular first electrodes 62, and outside of the out-most annular first electrode 62. The boundary defining frame 12 is used for spacing apart the first electrodes so as to guarantee that the first electrodes can operate independently and reliably.

Preferably, after forming the boundary defining frame 12 and prior to forming the red light emitting layer, it further comprises forming a first common layer 13; after forming the blue light emitting layer, it further comprises forming a second common layer 14, the second electrode layer 7 located in the structure of the second common layer. When the first electrode layer 6 is an anode layer, the structure of the common layer 13 can include a holed transmission layer, and the structure of the second common layer 14 can include the second electrode layer 7 as a cathode layer and a holed transmission layer located between the cathode layer and the blue light emitting layer.

It is evident that persons skilled in the art can make various changes and modifications to the present disclosure without departing from the spirit and the scope of the present disclosure. In this way, the present disclosure is also intended to include these changes and modifications if these changes and modifications belong to the scope of the claims of the present disclosure and their technical equivalents.

The invention claimed is:

1. An organic light emitting diode display panel, wherein it comprises a plurality of pixel units arranged in arrays, each pixel unit comprising a first electrode layer, a second electrode layer and at least three light emitting layers corresponding to different colors located between the first electrode layer and the second electrode layer, wherein:

the at least three light emitting layers includes a planar light emitting layer and at least two annular light emitting layers disposed concentrically with the planar light emitting layer and aligned radially;

the first electrode layer has a planar first electrode at a location that corresponds to the planar light emitting layer, and the first electrode layer has an annular first electrode at a location that corresponds to each annular light emitting layer, wherein the at least three light emitting layers include a red light emitting layer, a green light emitting layer and a blue light emitting layer, wherein the red light emitting layer is a planar light emitting layer, the green light emitting layer and the blue light emitting layer are annular light emitting layers respectively and are radially aligned, and wherein the organic light emitting diode display panel further comprises a first electron transmission layer disposed on the red light emitting layer and surrounded by the green light emitting layer, and a second electron transmission layer disposed on the first electron transmission layer and the green light emitting layer and surrounded by the blue light emitting layer.

2. The organic light emitting diode display panel according to claim 1, wherein a material of the first electron transmission layer is the same as a material of the green light emitting layer, and a material of the second electron transmission layer is the same as a material of the blue light emitting layer.

3. The organic light emitting diode display panel according to claim 1, wherein a boundary defining frame is provided respectively between the planar first electrode and the adjacent annular first electrode, between adjacent annular first electrodes, and outside of the out-most annular first electrode.

4. The organic light emitting diode display panel according to claim 2, wherein a boundary defining frame is provided respectively between the planar first electrode and the adjacent annular first electrode, between adjacent annular first electrodes, and outside of the out-most annular first electrode.

* * * * *